(12) United States Patent
Jung et al.

(10) Patent No.: US 9,564,605 B2
(45) Date of Patent: Feb. 7, 2017

(54) TRANSPARENT DISPLAY DEVICES INCLUDING A POLYMER SUBSTRATE COMPRISING COLORED PARTICLES WITH IMPROVED FLEXIBLE AND MECHANICAL PROPERTIES

(71) Applicant: Samsung Display Co., Ltd., Yongin (KR)

(72) Inventors: Seung-Ho Jung, Hwaseong-si (KR); Chaun-Gi Choi, Hwaseong-si (KR); Young-Sik Yoon, Seoul (KR); Joo-Hee Jeon, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/678,572

(22) Filed: Apr. 3, 2015

(65) Prior Publication Data

US 2016/0111666 A1    Apr. 21, 2016

(30) Foreign Application Priority Data

Oct. 20, 2014   (KR) .................. 10-2014-0141889

(51) Int. Cl.
*H01L 29/08* (2006.01)
*H01L 35/24* (2006.01)
*H01L 51/00* (2006.01)
*H01L 27/32* (2006.01)

(52) U.S. Cl.
CPC ....... *H01L 51/0097* (2013.01); *H01L 51/0096* (2013.01); *H01L 27/3246* (2013.01); *H01L 2227/323* (2013.01); *H01L 2251/5323* (2013.01)

(58) Field of Classification Search
None
See application file for complete search history.

(56) References Cited

U.S. PATENT DOCUMENTS

| 3,026,283 | A | | 3/1962 | Conrad et al. |
| 5,461,494 | A | * | 10/1995 | Sekimura .......... G02F 1/133512 349/106 |
| 6,258,158 | B1 | | 7/2001 | Bugnon et al. |
| 7,579,397 | B2 | | 8/2009 | Nelson et al. |
| 2003/0218714 | A1 | | 11/2003 | Song et al. |

(Continued)

FOREIGN PATENT DOCUMENTS

| CN | 102097454 | 6/2011 |
| JP | 2009-185205 | 8/2009 |

(Continued)

OTHER PUBLICATIONS

Partial European Search Report issued on Mar. 17, 2016, in European Patent Application No. 15169643.2.

(Continued)

*Primary Examiner* — Mohammad Islam
*Assistant Examiner* — Jay C Chang
(74) *Attorney, Agent, or Firm* — H.C. Park & Associates, PLC

(57) ABSTRACT

A transparent display device including a polymer substrate having colored particles distributed therein, a pixel circuit on the polymer substrate, a first electrode electrically connected to the pixel circuit, a display layer on the first electrode, and a second electrode facing the first electrode and covering the display layer.

14 Claims, 7 Drawing Sheets

(56) References Cited

U.S. PATENT DOCUMENTS

| | | | |
|---|---|---|---|
| 2008/0245968 A1* | 10/2008 | Tredwell | G01T 1/2018 250/370.09 |
| 2009/0258977 A1* | 10/2009 | Smetana | C08J 3/203 524/100 |
| 2010/0273954 A1* | 10/2010 | Sohn | C08G 73/105 525/420 |
| 2011/0084276 A1* | 4/2011 | Kang | H01L 29/78609 257/57 |
| 2011/0311796 A1* | 12/2011 | Jung | C08J 5/18 428/220 |
| 2012/0095147 A1 | 4/2012 | Huang et al. | |
| 2013/0026478 A1 | 1/2013 | Noda et al. | |
| 2015/0029638 A1* | 1/2015 | Kirner | C08G 73/1042 361/311 |

FOREIGN PATENT DOCUMENTS

| | | |
|---|---|---|
| KR | 10-2002-0017315 | 3/2002 |
| KR | 10-2009-0019110 | 2/2009 |
| KR | 10-2011-0078936 | 7/2011 |
| WO | 2009/017330 | 2/2009 |
| WO | 2013/047493 | 4/2013 |
| WO | 2013/161970 | 10/2013 |

OTHER PUBLICATIONS

Chien et al. "High-Performance Flexible a-IGZO TFTs Adopting Stacked Electrodes and Transparent Polyimide-Based Nanocomposite Substrates", IEEE Transactions on Electronic Devices, May 2011, vol. 58, No. 5, pp. 1440-1446.

* cited by examiner

TRANSPARENT DISPLAY DEVICES INCLUDING A POLYMER SUBSTRATE COMPRISING COLORED PARTICLES WITH IMPROVED FLEXIBLE AND MECHANICAL PROPERTIES

CROSS-REFERENCE TO RELATED APPLICATION

This application claims priority from and the benefit of Korean Patent Application No. 10-2014-0141889, filed on Oct. 20, 2014, which is hereby incorporated by reference for all purposes as if fully set forth herein.

BACKGROUND

Field

Exemplary embodiments relate to transparent display devices and methods of manufacturing the same. More particularly, exemplary embodiments relate to transparent display devices including a transparent substrate and methods of manufacturing the same.

Discussion of the Background

Recently, a display device having transparent or transmitting properties has been developed. For example, a base substrate having the transparent or transmitting properties may be employed to achieve a transparent display device. If a transparent resin substrate is implemented as the base substrate, a flexible transparent display device may be realized that may be capable of being folded or bended.

However, a resin material or a polymer material of the transparent resin substrate may be chemically modified during a device process to cause a deterioration of various properties of the base substrate or the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a transparent display device having improved transmissive and mechanical properties.

Further exemplary embodiments provide a method of manufacturing a transparent display device having improved transmissive and mechanical properties.

Additional aspects will be set forth in the detailed description which follows, and, in part, will be apparent from the disclosure, or may be learned by practice of the inventive concept.

According to an exemplary embodiment, there is provided a transparent display device including a polymer substrate including colored particles distributed therein, a pixel circuit on the polymer substrate, a first electrode electrically connected to the pixel circuit, a display layer on the first electrode, and a second electrode facing the first electrode and covering the display layer.

According to another exemplary embodiment, there is provided a transparent display device that includes a transparent flexible substrate divided into a pixel area and a transmission area and including colored particles dispersed therein throughout the pixel area and the transmission area, a barrier layer on the transparent flexible substrate, a pixel circuit selectively disposed on a portion of the barrier layer on the pixel area, a circuit insulation layer at least partially covering the pixel circuit on the barrier layer, a via insulation layer covering the pixel circuit on the circuit insulation layer, a first electrode electrically connected to the pixel circuit on the via insulation layer, a display layer on the first electrode, and a second electrode facing the first electrode and covering the display layer.

According to yet another exemplary embodiment, there is provided a method of manufacturing a transparent display device. In the method, a precursor composition is coated on a carrier substrate. The precursor composition includes a blue dye dispersed therein. The precursor composition is cured to form a transparent substrate on the carrier substrate. The transparent substrate includes a colored polymer material. A pixel circuit is formed on the transparent substrate. An insulation structure covering the pixel circuit is formed. A display structure is formed on the insulation structure such that the display structure is electrically connected to the pixel circuit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 1 is a cross-sectional view illustrating a transparent display device in accordance with exemplary embodiments.

FIG. 2 is a cross-sectional view illustrating a transparent display device in accordance with exemplary embodiments.

FIG. 3, FIG. 4, FIG. 5, and FIG. 6 are cross-sectional views illustrating a method of manufacturing a transparent display device in accordance with exemplary embodiments.

FIG. 7 is a cross-sectional view illustrating a transparent display device in accordance with some exemplary embodiments.

FIG. 8 is a cross-sectional view illustrating a transparent display device in accordance with some exemplary embodiments.

FIG. 9, FIG. 10, and FIG. 11 are cross-sectional views illustrating a method of manufacturing a transparent display device in accordance with some exemplary embodiments.

FIG. 12, FIG. 13, and FIG. 14 are cross-sectional views illustrating a method of manufacturing a transparent display device in accordance with some exemplary embodiments.

DETAILED DESCRIPTION OF THE ILLUSTRATED EMBODIMENTS

Figure 1:
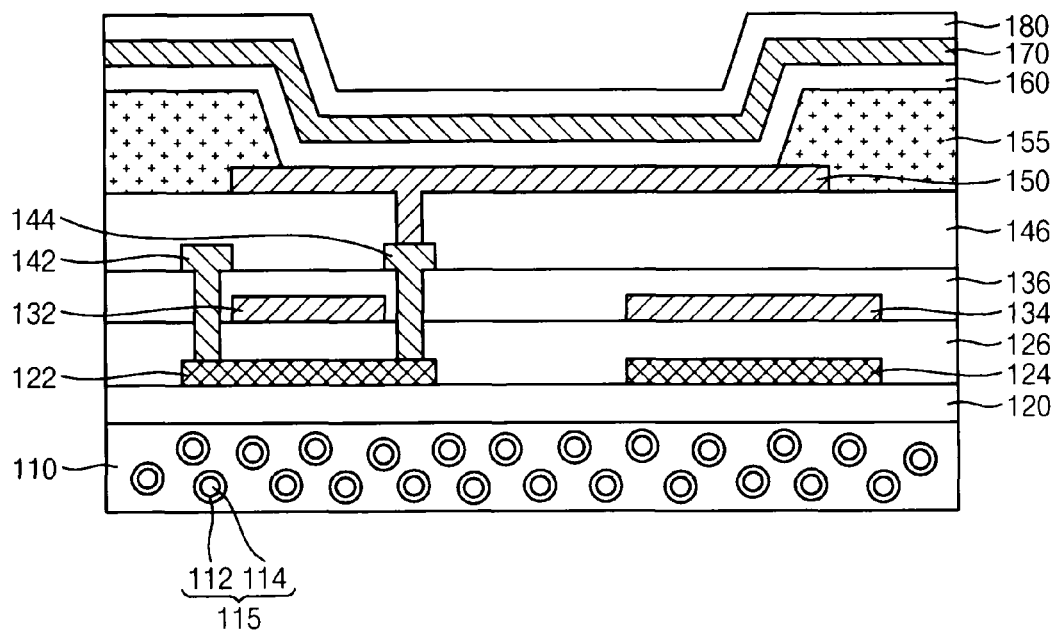
FIGS. 1 to 14 represent non-limiting, exemplary embodiments as described herein.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a transparent display device in accordance with exemplary embodiments.

Referring to FIG. 1, the transparent display device may include a substrate 110, a back plane (BP) structure formed on the substrate 110, and a display structure stacked on the BP structure.

The substrate 110 may be provided as a back plane substrate or a base substrate. A transparent insulation substrate may be used as the substrate 110. For example, a polymer-based substrate having transmissive and flexible properties may be utilized. Accordingly, the transparent display device may be provided as a transparent flexible display device.

In exemplary embodiments, a colored polymer substrate may be used as the substrate 110. For example, the colored polymer substrate may include a substantially yellow polyimide-based material.

For example, a connecting group having a relatively small steric hindrance may be combined between imide nitrogens of imide units contained in the polyimide-based material. Examples of the connecting group may include an aromatic group such as unsubsituted benzene.

A combination of the imide nitrogens and the connecting group may serve as an electron donor unit. A carbonyl group included in the imide unit and adjacent to the imide nitrogen may have a relatively low electron density, and thus may serve as an electron acceptor unit.

In this case, a charge transfer complex (CTC) between neighboring polymer chains may be formed by an intermolecular interaction between the electron donor unit and the electron acceptor unit. Accordingly, a heat resistance and a mechanical stability of the substrate 110 may be enhanced. A wavelength in a range of a visible light, e.g., in a range of about 560 nm to about 580 nm may be absorbed by the CTC. Thus, the substrate 110 may be transformed into the colored polymer substrate having a yellow color.

In exemplary embodiments, colored particles 115 may be embedded in the substrate 110. For example, the colored particle 115 may include a dispersed particle 114 and a colored layer 112 that may be coated on or mixed in the dispersed particle 114.

In some embodiments, the dispersed particle 114 may include a nano-particle having an improved dispersive property in, e.g., a liquid polymer composition. Examples of the nano-particle may include an inorganic nano-particle, e.g., silica or a metal oxide such as alumina. In an embodiment, silica may be utilized as the nano-particle.

The colored layer 112 may be coated on a surface of the dispersed particle 114. If the dispersed particle 114 has a porous structure such as porous silica, the colored layer 112 may penetrate into pores of the dispersed particle 114 to be substantially incorporated with the dispersed particle 114.

In exemplary embodiments, the colored layer 112 may have a color different from that of the substrate 110, e.g., a color that may be corrected by the substrate 110 provided as the colored polymer substrate.

As described above, if the substrate 110 includes a yellow polymer substrate, the colored layer 112 may have a substantially blue color. For example, the colored layer 112 may include a blue dye material such as anthraquinone, azo, phthalocyanine, indigo, or quinophthalone based materials. These may be used alone or in a combination thereof.

The colored particles 115 may be substantially and uniformly distributed in the substrate 110. Accordingly, the substrate 110 provided as the yellow polymer substrate and the colored particles 115 having the blue color may be mixed optically and additively so that the substrate 110 may be substantially transformed entirely into a white or a transparent substrate.

The BP structure including a pixel circuit and an insulation structure may be disposed on the substrate 110. The pixel circuit may include, e.g., a thin film transistor (TFT) and a wiring structure. The insulation structure may include, e.g., a barrier layer 120, a gate insulation layer 126, an insulating interlayer 136, and a via insulation layer 146 sequentially stacked on the substrate 110.

The barrier layer 120 may be formed on the substrate 110. The diffusion of impurities or moisture between the substrate 110 and structures thereon may be blocked by the barrier layer 120. The barrier layer 120 may have a multi-stacked structure including a silicon oxide layer and a silicon nitride layer that may be alternately and repeatedly formed.

In some embodiments, a buffer layer may be further formed on the barrier layer 120. The buffer layer may have a multi-stacked structure including a silicon oxide layer and a silicon nitride layer.

An active pattern may be disposed on the barrier layer 120. In exemplary embodiments, the active pattern may include a first active pattern 122 and a second active pattern 124.

The active pattern may include a silicon-based compound such as polysilicon. In an embodiment, a source region and a drain region including p-type or n-type impurities may be formed at both ends of the first active pattern 122.

In some embodiments, the active pattern may include a semiconductor oxide, e.g., indium gallium zinc oxide (IGZO), zinc tin oxide (ZTO), or indium tin zinc oxide (ITZO).

As illustrated in FIG. 1, the first and second active patterns 122 and 124 may be located on substantially the same level or the same plane.

The gate insulation layer 126 may be formed on the barrier layer 120 to cover the active patterns. The gate insulation layer 126 may include silicon oxide or silicon nitride. In some embodiments, the gate insulation layer 126 may have a multi-stacked structure including a silicon oxide layer and a silicon nitride layer.

A gate electrode may be disposed on the gate insulation layer 126. In some embodiments, the gate electrode may include a first gate electrode 132 and a second gate electrode 134. The first gate electrode 132 and the second gate electrode 134 may be substantially superimposed over the first active pattern 122 and the second active pattern 124, respectively. The first and second gate electrodes 132 and 134 may be located on substantially the same level or the same plane.

The gate electrode may include a metal, such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), or scandium (Sc), an alloy of the metals, or a nitride of the metal. These may be used alone or in a combination thereof. In some embodiments, the gate electrode may have a multi-layered structure including Al and Mo, or Ti and Cu for reducing an electrical resistance.

The insulating interlayer 136 may be formed on the gate insulation layer 126 to cover the gate electrodes 132 and 134. The insulating interlayer 136 may include silicon oxide or silicon nitride. In some embodiments, the insulating interlayer 136 may have a multi-stacked structure including a silicon oxide layer and a silicon nitride layer.

A source electrode 142 and a drain electrode 144 may extend through the insulating interlayer 136 and the gate insulation layer 126 to be in contact with the first active pattern 122. The source and drain electrodes 142 and 144 may include a metal such as Al, Ag, W, Cu, Ni, Cr, Mo, Ti, Pt, Ta, Nd, or Sc, an alloy of the metals or a nitride of the metal. These may be used alone or in a combination thereof. The source and drain electrodes 142 and 144 may have a multi-layered structure including different metals such as Al and Mo.

The source electrode 142 and the drain electrode 144 may be in contact with the source region and the drain region of the first active pattern 122, respectively.

The TFT may be defined by the first active pattern 122, the gate insulation layer 126, the first gate electrode 132, the source electrode 142 and the drain electrode 144. Additionally, a capacitor may be defined by the second active pattern 124, the gate insulation layer 126 and the second gate electrode 134.

The wiring structure may include a data line and a scan line. A plurality of the data lines and the scan lines may cross each other, and each pixel may be defined at each intersection region of the data lines and the scan lines. For example, the data line may be electrically connected to the source electrode 142, and the scan line may be electrically connected to the first gate electrode 132. In some embodiments, the wiring structure may further include a power line (Vdd) that may be parallel to the data line. The capacitor may be electrically connected to the power line and the TFT.

The via insulation layer 146 may be formed on the insulating interlayer 136 to cover the source and drain electrodes 142 and 144. The via insulation layer 146 may substantially serve as a planarization layer. For example, the via insulation layer 146 may include an organic material such as polyimide, an epoxy-based resin, an acryl-based resin, or polyester.

The display structure may be stacked on the via insulation layer 146. In exemplary embodiments, the display structure may include a first electrode 150, a display layer 160 and a second electrode 170 sequentially stacked on the via insulation layer 146.

The first electrode 150 may be disposed on the via insulation layer 146. The first electrode 150 may include a via portion that may extend through the via insulation layer 146 to be electrically connected to the drain electrode 144.

In exemplary embodiments, the first electrode 150 may serve as a pixel electrode, and may be formed per each pixel. The first electrode 150 may serve as an anode of the transparent display device.

In an embodiment, the first electrode 150 may serve as a reflective electrode. In this case, the first electrode 150 may include a metal such as Al, Ag, W, Cu, Ni, Cr, Mo, Ti, Pt, Ta, Nd or Sc, or an alloy of the metals. The transparent display device may be a top emission type generating an image toward the second electrode 170.

In an embodiment, the first electrode 150 may include a transparent conductive material having a high work function. For example, the first electrode 150 may include indium tin oxide (ITO), indium zinc oxide (IZO), zinc oxide, or indium oxide.

In an embodiment, the first electrode 150 may have a multi-layered structure including the transparent conductive material and the metal.

A pixel defining layer (PDL) 155 may be formed on the via insulation layer 146, and may cover a peripheral portion of the first electrode 150. The PDL 155 may include, e.g., a transparent organic material such as a polyimide-based resin or an acryl-based resin. An area of the first electrode 150 that is not covered by the PDL 155 may be substantially equal to an area of an emission region in the each pixel.

The display layer 160 may be disposed on the PDL 155 and the first electrode 150. The display layer 160 may include an organic emitting layer that may be individually patterned for each of a red pixel (Pr), a green pixel (Pg) and a blue pixel (Pb) to generate a different color of light in the each pixel. The organic emitting layer may include a host material excited by a hole or an electron, and a dopant material for improving an emitting efficiency through absorbing and releasing energy.

In some embodiments, the display layer 160 may further include a hole transport layer (HTL) interposed between the first electrode 150 and the organic emitting layer. The display layer 160 may further include an electron transport layer (ETL) interposed between the second electrode 170 and the organic emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino] biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline (Pq), or a combination thereof.

In some embodiments, the display layer 160 may include a liquid crystal layer instead of the organic light emitting layer. In this case, the transparent display device may be provided as a liquid crystal display (LCD) device.

The display layer 160 may extend conformally on surfaces of the PDL 155 and the first electrode 150 as illustrated in FIG. 1. In some embodiments, the display layer 160 may be confined by sidewalls of the PDL 155 to be individually provided in the each pixel.

The second electrode 170 may be disposed on the PDL 155 and the display layer 160. In exemplary embodiments, the second electrode 170 may serve as a common electrode provided on a plurality of the pixels. The second electrode 170 may face the first electrode 150 and may serve as a cathode of the transparent display device.

The second electrode 170 may include a metal having a low work function such as Al, Ag, W, Cu, Ni, Cr, Mo, Ti, Pt, Ta, Nd, or Sc, or an alloy of the metals.

An encapsulation layer 180 protecting the display structure may be formed on the second electrode 170. The encapsulation layer 180 may include, e.g., an inorganic material such as silicon nitride and/or a metal oxide.

In some embodiments, a capping layer (not shown) may be interposed between the second electrode 170 and the encapsulation layer 180. The capping layer may include an organic material such as a polyimide resin, an epoxy resin, or an acryl resin, or an inorganic material such as silicon oxide, silicon nitride, or silicon oxynitride.

Figure 2:
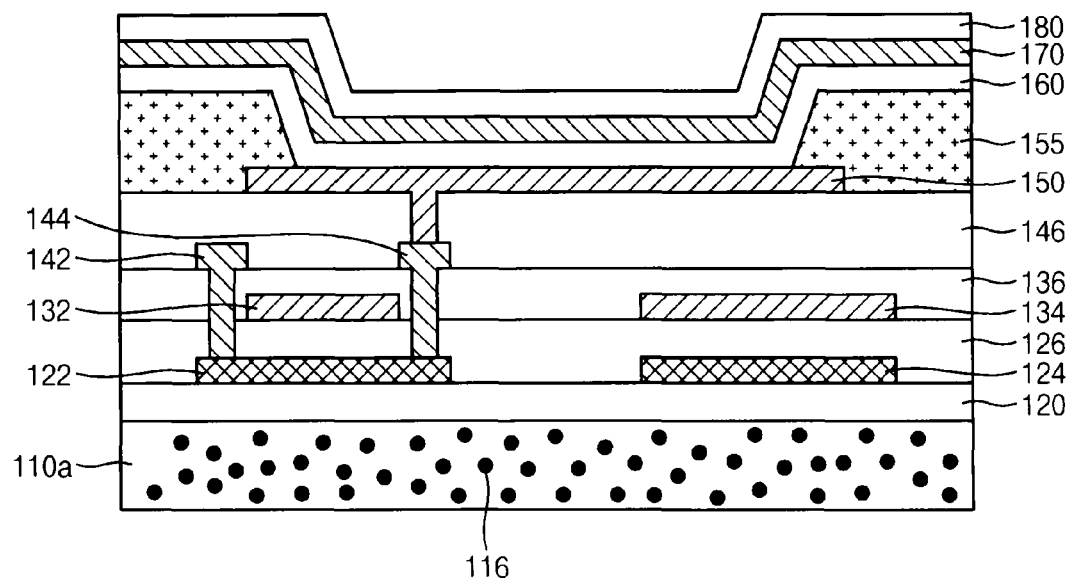

FIG. 2 is a cross-sectional view illustrating a transparent display device in accordance with exemplary embodiments.

The transparent display device of FIG. 2 may have elements and/or be arranged substantially the same as or similar to those illustrated in FIG. 1 except for the structure of the substrate. Thus, like reference numerals are used to designate like elements, and a detailed description of these elements are omitted.

Referring to FIG. 2, a substrate 110a of the transparent display device may include blue dye molecules 116 integrally incorporated with a polyimide polymer matrix.

In some embodiments, the blue dye molecules 116 may be substantially and uniformly distributed in the substrate 110a including the polyimide polymer matrix.

In some embodiments, the blue dye molecules 116 may be polymerized or condensed together with polyimide precursors to form the polyimide polymer matrix.

Accordingly, a color addition or a color compensation may occur between the colored polymer substrate having a substantially yellow color as described above, and the blue dye molecules 116 so that the substrate 110a may be substantially white or transparent.

FIGS. 3 to 6 are cross-sectional views illustrating a method of manufacturing a transparent display device in accordance with exemplary embodiments.

Figure 3:
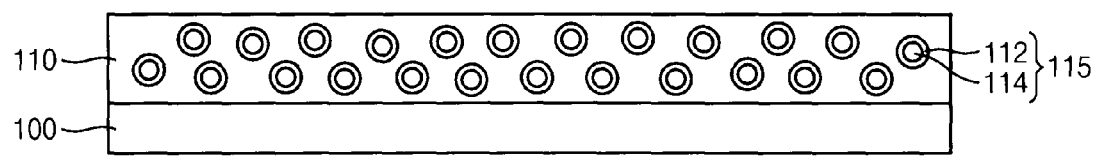

Referring to FIG. 3, a substrate 110 may be formed on a carrier substrate 100.

The carrier substrate 100 may serve as a support during processes for manufacturing the transparent display device. For example, a glass substrate or a metal substrate may be utilized as the carrier substrate 100.

In exemplary embodiments, a precursor composition containing a polyimide precursor may be coated on the carrier substrate 100 by, e.g., a spin coating process to form a coating layer.

The polyimide precursor may include a diamine and a dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethylacetate (ethylacetate), dimethylsulfoxide (DMSO), or an ethylene glycol-based ether solvent. These may be used alone or in a combination thereof.

In some embodiments, tetra carboxylic acid dianhydride may be used as the dianhydride, and dianiline may be used as the diamine.

In exemplary embodiments, colored particles 115 may be mixed and stirred in the precursor composition to be uniformly dispersed therein.

For example, dispersed particles 114 such as silica nanoparticles may be immersed in a liquid blue dye, and then cleaning and drying processes may be performed to obtain the colored particles 115. In each of the colored particles 115, a colored layer 112 may be coated on each of the dispersed particles 114. The blue dye may include anthraquinone, azo, phthalocyanine, indigo or quinophthalone based materials.

In some embodiments, the dispersed particle 114 may have a porous structure. In this case, the colored layer 112 may penetrate into pores of the dispersed particle 114 to be substantially incorporated with the dispersed particle 114.

A thermal curing process may be performed after the formation of the coating layer. The organic solvent may be vaporized and a polymerization reaction may be initiated by the thermal curing process. The dianhydride and the diamine may be combined to form a polyamic acid structure by the polymerization process. Subsequently, an additional thermal treatment may be performed so that a nitrogen atom of an amide included in the polyamic acid structure may attack a carbon atom of a carboxylic group. Thus, an imidization may be progressed, and thus, a polyimide structure may be created by the imidization.

As described above, if dianiline is used as the diamine, a benzene ring may be interposed between imide nitrogens neighboring each other in a polyimide chain to form an electron donor unit. An intramolecular interaction of the electron donor unit and an electron acceptor unit including, e.g., a carbonyl group may occur, and thus the polyimide chains may be combined by an intermolecular interaction generated from the intramolecular interaction to form a charge transfer complex (CTC).

As described above, the heat resistance and mechanical properties of the substrate 110 may be improved by the formation of the CTC. A wavelength of a visible light may be absorbed by the CTC, and thus, e.g., a yellow colored polymer substrate including polyimide may be formed.

The colored particles 115 may be uniformly distributed and fixed in the colored polymer substrate by the thermal curing process. Accordingly, a color addition or a color correction of the colored particles 115 having a blue color and the colored polymer substrate having a yellow color may occur so that the substrate 110 may be substantially white or transparent.

In some embodiments, as illustrated with reference to FIG. 2, blue dye molecules 116 may be uniformly distributed in the colored polymer substrate.

In this case, the blue dye materials mentioned above may be pre-dispersed in the precursor composition and uniformly mixed therein. The blue dye molecules 116 may be uniformly distributed in the colored polymer substrate through aggregation, bridging or immobilization of the blue dye materials by the thermal curing process.

In some embodiments, the blue dye molecule 116 may include a cross-linkable terminal group such as a vinyl group. In this case, the blue dye molecule 116 may participate in the polymerization reaction during the thermal curing process, and thus may be incorporated in the polyimide structure or the polyimide chain as a repeating unit.

Figure 4:
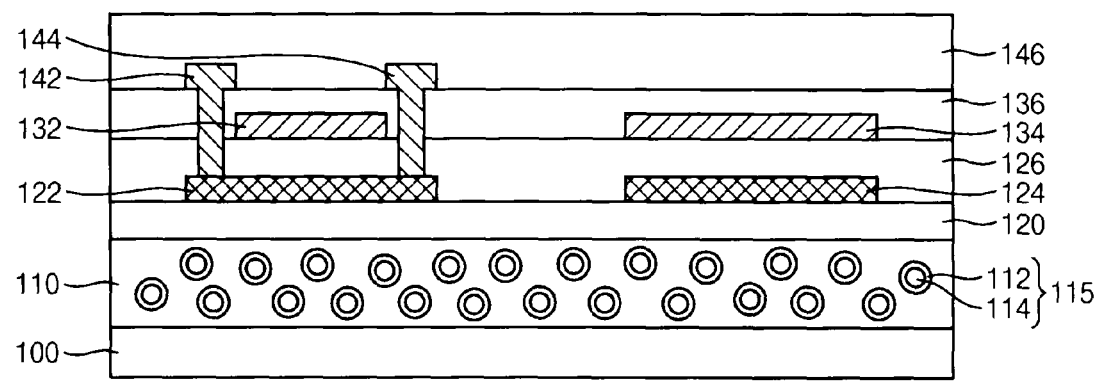

Referring to FIG. 4, a BP structure including a pixel circuit and an insulation structure may be formed on the substrate 110.

In exemplary embodiments, a barrier layer 120 may be formed on the substrate 110. The barrier layer 120 may be formed by repeatedly depositing silicon oxide and silicon nitride.

First and second active patterns 122 and 124 may be formed on the barrier layer 120.

In exemplary embodiments, a semiconductor layer may be formed on the barrier layer 120 using amorphous silicon or polysilicon, and then may be patterned to form the first and second active patterns 122 and 124.

In some embodiments, a crystallization process, e.g., a low temperature polycrystalline silicon (LTPS) process or a laser crystallization process may be further performed after the formation of the semiconductor layer. As described above, the substrate 110 may include the colored polymer substrate having the improved heat resistance and mechanical properties of the CTC. Thus, flexible and mechanical properties of the substrate 110 may be maintained even after the crystallization process.

In some embodiments, the semiconductor layer may be formed of a semiconductor oxide such as IGZO, ZTO, or ITZO.

A gate insulation layer 126 covering the active patterns 122 and 124 may be formed on the barrier layer 120, and gate electrodes 132 and 134 may be formed on the gate insulation layer 126.

The gate insulation layer 126 may be formed by solely or repeatedly depositing silicon oxide and silicon nitride.

For example, a first conductive layer may be formed on the gate insulation layer 126, and may be etched by, e.g., a photolithography process, to form a first gate electrode 132 and a second gate electrode 134. The first gate electrode 132 and the second gate electrode 134 may substantially overlap the first active pattern 122 and the second active pattern 124, respectively, with respect to the gate insulation layer 126.

The first conductive layer may be formed using a metal, an alloy, or a metal nitride. The first conductive layer may be formed by depositing a plurality of metal layers.

The gate electrodes 132 and 134 may be formed simultaneously with a scan line. For example, the gate electrodes 132 and 134, and the scan line may be formed from the first conductive layer by substantially the same etching process. The scan line may be integrally connected to the first gate electrode 132.

In some embodiments, impurities may be implanted into the first active pattern 122 using the first gate electrode 132 as an ion-implantation mask such that a source region and a drain region may be formed at both ends of the first active pattern 122. A portion of the first active pattern 122 between the source and drain regions may serve as a channel region substantially overlapping the first gate electrode 132.

An insulating interlayer 136 covering the gate electrodes 132 and 134 may be formed on the gate insulation layer 126. A source electrode 142 and a drain electrode 144 may be formed through the insulating interlayer 136 and the gate insulation layer 126 to be in contact with the first active pattern 122.

For example, the insulating interlayer 136 and the gate insulation layer 126 may be partially etched to form contact holes through which the first active pattern 122 may be partially exposed. A second conductive layer filling the contact holes may be formed on the insulating interlayer 136, and then may be patterned by a photolithography process to form the source electrode 142 and the drain electrode 144.

In some embodiments, the source electrode 142 and the drain electrode 144 may be in contact with the source region and the drain region, respectively. The source electrode 142 may be integrally connected to a data line. In this case, the source electrode 142, the drain electrode 144 and the data line may be formed from the second conductive layer by substantially the same etching process.

The insulating interlayer 136 may be formed by depositing silicon oxide and/or silicon nitride. The second conductive layer may be formed using a metal, an alloy or a metal nitride. The second conductive layer may be formed by depositing a plurality of metal layers.

By performing the above-mentioned processes, a TFT including the source electrode 142, the drain electrode 144, the gate electrode 132, the gate insulation layer 126 and the first active pattern 122 may be formed on the substrate 110. A capacitor including the second active pattern 124, the gate insulation layer 126 and the second gate electrode 134 may be also formed. Accordingly, the pixel circuit including the data line, the scan line, the TFT and the capacitor may be formed on the substrate 110.

Subsequently, a via insulation layer 146 covering the source electrode 142 and the drain electrode 144 may be formed on the insulating interlayer 136.

For example, the via insulation layer 146 may be formed using a transparent organic material such as polyimide, an epoxy-based resin, an acryl-based resin, or polyester. The via insulation layer 146 may have a sufficient thickness to have a substantially level or planar top surface.

The barrier layer 120, the semiconductor layer, the first and second conductive layers, the gate insulation layer 126, the insulating interlayer 136 and the via insulation layer 146 may be formed by at least one of a chemical vapor deposition (CVD) process, a plasma enhanced chemical vapor deposition (PECVD) process, a high density plasma-chemical vapor deposition (HDP-CVD) process, a thermal evaporation process, a vacuum deposition process, a spin coating process, a sputtering process, an atomic layer deposition (ALD) process, and a printing process.

Figure 5:
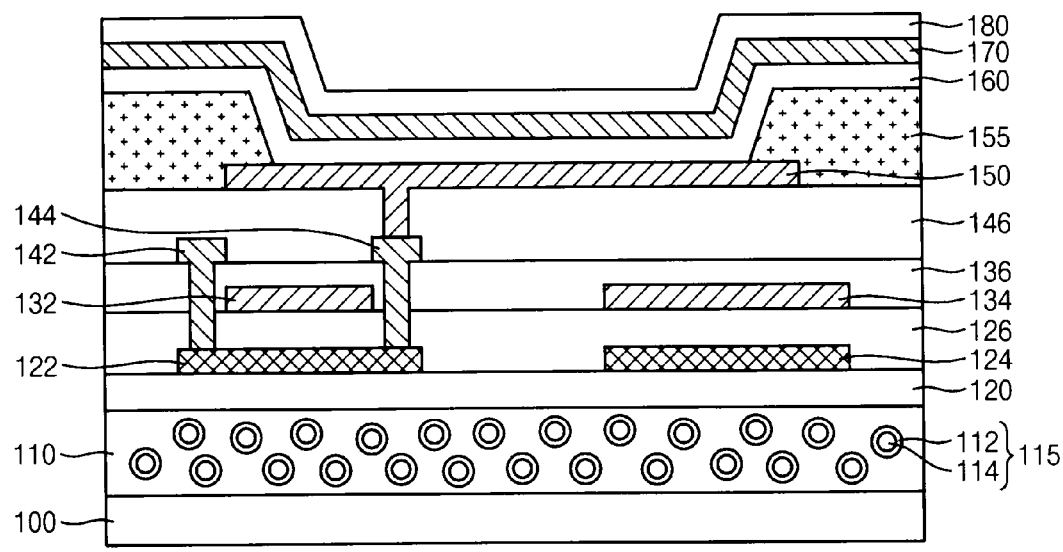

Referring to FIG. 5, the display structure may be formed on the BP structure

In exemplary embodiments, a first electrode 150 electrically connected to the TFT may be formed. For example, the via insulation layer 146 may be partially etched to form a via hole through which the drain electrode 144 may be exposed. A third conductive layer sufficiently filling the via hole may be formed on the via insulation layer 146 and the drain electrode 144, and then may be patterned to form the first electrode 150.

The third conductive layer may be formed using a metal such as Al, Ag, W, Cu, Ni, Cr, Mo, Ti, Pt, Ta, Nd, or Sc, or an alloy of the metals by a thermal evaporation process, a vacuum deposition process, a sputtering process, an ALD process, a CVD process, a printing process, etc. In some embodiments, the third conductive layer may be formed using a transparent conductive material such as ITO, IZO, zinc oxide or indium oxide.

A PDL 155 may be formed on the via insulation layer 146. The PDL 155 may cover a peripheral portion of the first electrode 150. For example, a photosensitive organic material such as a polyimide resin or an acryl resin may be coated, and then exposure and developing processes may be performed to form the PDL 155.

A display layer 160 may be formed on the PDL 155 and the first electrode 150.

The display layer 160 may be formed using an organic light emitting material for generating a red color of light, a blue color of light or a green color of light. For example, the display layer 160 may be formed by a spin coating process, a roll printing process, a nozzle printing process, an inkjet process, etc., using a fine metal mask (FMM) that may include an opening through which a region corresponding to a red pixel, a green pixel, or a blue pixel is exposed. Accordingly, an organic emitting layer including the organic light emitting material may be individually formed in each pixel.

In some embodiments, an HTL may be formed before the formation of the organic emitting layer using the above-mentioned hole transport material. An ETL may be also formed on the organic emitting layer using the above-mentioned electron transport material. The HTL and the ETL may be formed conformally on surfaces of the PDL 155 and the first electrode 150 to be provided commonly on a plurality of pixels. Alternatively, the ETL or the ETL may be patterned per each pixel by processes substantially the same as or similar to those for the organic emitting layer.

A metal having a low work function such as Al, Ag, W, Cu, Ni, Cr, Mo, Ti, Pt, Ta, Nd, or Sc, or an alloy of the metals may be deposited on the display layer 160 to form a second electrode 170. For example, a mask, including an opening through which a plurality of the pixels are commonly exposed, may be used to deposit the metal for the formation of the second electrode 170.

An encapsulation layer 180 may be formed on the second electrode 170. For example, the encapsulation layer 180 may be formed by depositing an inorganic material such as silicon nitride and/or a metal oxide. In an embodiment, a capping layer (not shown) may be further formed between the second electrode 170 and the encapsulation layer 180 using an organic material such as a polyimide resin, an epoxy resin, or an acryl resin, or an inorganic material such as silicon oxide, silicon nitride, or silicon oxynitride.

Figure 6:
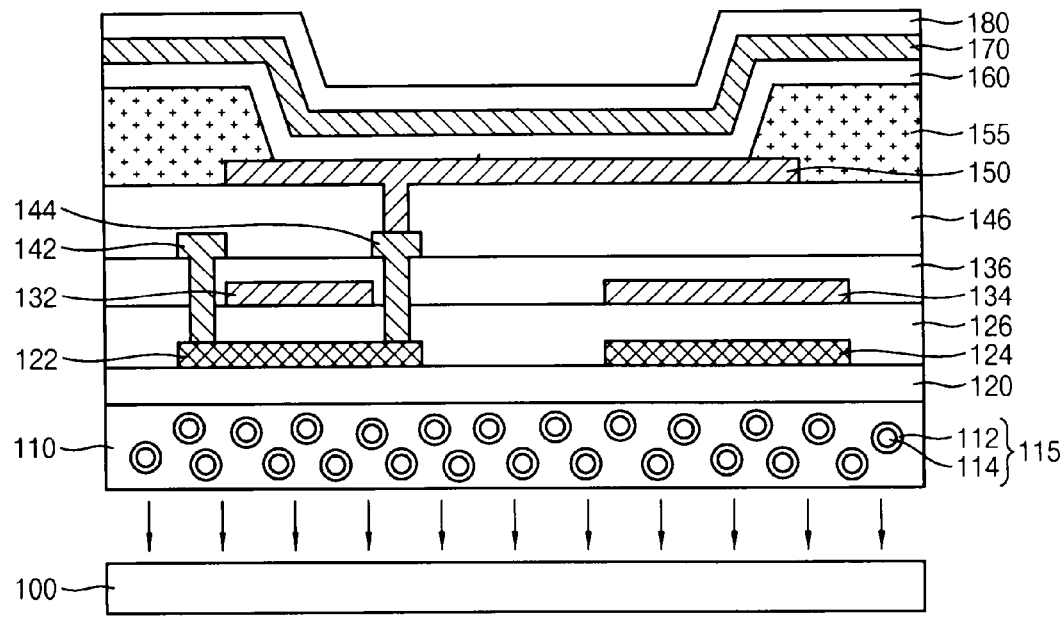

Referring to FIG. 6, the carrier substrate 100 may be detached from the substrate 110. For example, a laser-lift process may be performed to separate the carrier substrate 100 from the substrate 110. Alternatively, a mechanical tension may be applied to detach the carrier substrate 100 without performing the laser-lift process.

Figure 7:
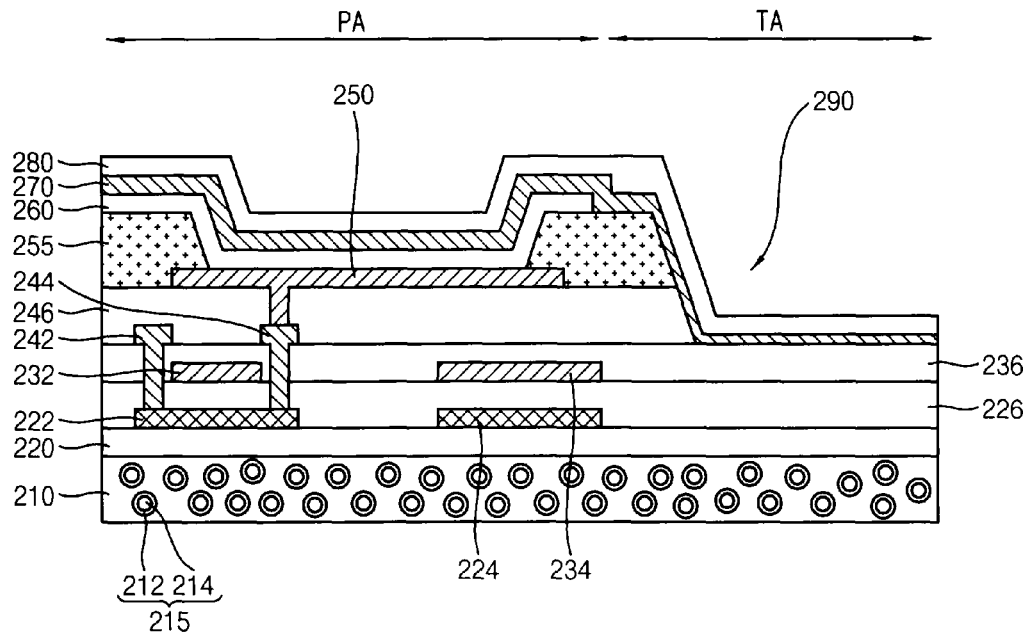

FIG. 7 is a cross-sectional view illustrating a transparent display device in accordance with some exemplary embodiments The transparent display device of FIG. 7 may have elements and/or arrangements substantially the same as or similar to those illustrated with reference to FIG. 1 except for the addition of a transmission area. Thus, like reference numerals are used to designate like elements, and detailed descriptions of the elements and/or structures are omitted.

Referring to FIG. 7, the transparent display device may include a pixel area PA and a transmission area TA.

A red pixel, a green pixel and a blue pixel may be alternately arranged in the pixel area PA. The transmission area TA may extend to be laterally adjacent to the pixels.

As illustrated in FIG. 1, the substrate 200 in FIG. 7 may include a colored polymer substrate having a substantially yellow color, and colored particles 215 having a blue color may be uniformly distributed in the colored polymer substrate. The colored particles 215 may include dispersed particles 214, each of which may include a colored layer 212 coated thereon or incorporated therewith. In alternate embodiments, as illustrated in FIG. 2, blue dye molecules may be uniformly distributed in the colored polymer substrate.

A pixel circuit and an insulation structure may be disposed on the substrate 200 in the pixel area PA. As illustrated with reference to FIG. 1, the pixel circuit may include a TFT, a capacitor and a wiring structure.

The TFT may include a first active pattern 222, a gate insulation layer 226, a first gate electrode 232, a source electrode 242 and a drain electrode 244. The capacitor may include a second active pattern 224, the gate insulation layer 226 and the second gate electrode 234.

The insulation structure may include a barrier layer 220, the gate insulation layer 226, an insulating interlayer 236 and a via insulation layer 246 sequentially stacked on the substrate 210.

In exemplary embodiments, the barrier layer 220, the gate insulation layer 226 and the insulating interlayer 236 among the insulation structure may be provided commonly on the pixel area PA and the transmission area TA. The via insulation layer 246 among the insulation structure may be substantially removed on the transmission area TA. Thus, the via insulation layer 246 may be substantially present only on the pixel area PA.

A display structure may be stacked on the via insulation layer 246. As illustrated with reference to FIG. 1, the display structure in FIG. 7 may include a first electrode 250, a display layer 260 and a second electrode 270 sequentially stacked on the via insulation layer 246. A PDL 255 may be disposed selectively on the pixel area PA to at least partially expose the first electrode 250.

A transmitting window 290 may be defined on the transmission area TA. In exemplary embodiments, a top surface of the insulating interlayer 236 may be exposed through the transmitting window 290. In this case, the transmitting window 290 may be defined by sidewalls of the PDL 255 and the via insulation layer 246, and the top surface of the insulating interlayer 236.

As illustrated in FIG. 7, the second electrode 270 may be commonly and continuously disposed on the pixel area PA and the transmission area TA. In this case, the second electrode 270 may extend conformally on surfaces of the display layer 260 and the PDL 255, and a sidewall and a bottom of the transmitting window 290.

In some embodiments, a portion of the second electrode 270 on the transmission area TA may have a thickness smaller than that of a portion of the second electrode 270 on the pixel area PA. Accordingly, a transparency or a transmittance in the transmission area TA may be improved.

An encapsulation layer 280 may be disposed on the second electrode 270, and may commonly cover the pixel area PA and the transmission area TA.

According to exemplary embodiments described above, the substrate 210 may be substantially transparent by, e.g., a color addition with the colored particles 215. Therefore, even though the barrier layer 220, the gate insulation layer 226 and the insulating interlayer 236 are not removed on the transmission area TA, a predetermined transmittance or transparency of the transparent display device may be achieved.

Figure 8:
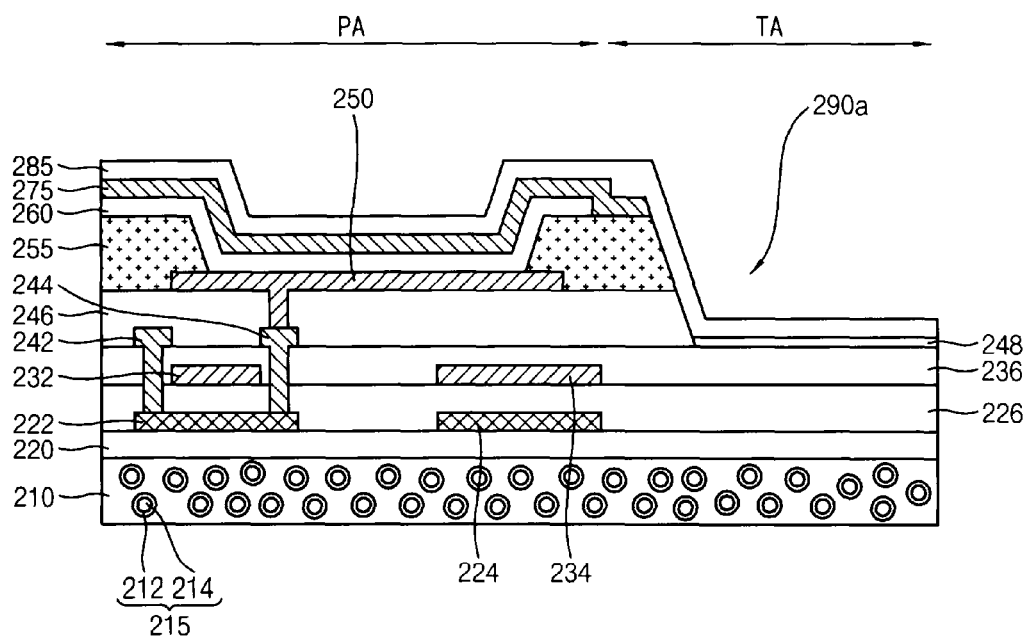

FIG. 8 is a cross-sectional view illustrating a transparent display device in accordance with some exemplary embodiments.

The transparent display device of FIG. 8 may have elements and/or arrangements substantially the same as or similar to those illustrated with reference to FIG. 7 except for a structure of a transmission area. Thus, like reference numerals are used to designate like elements and detailed descriptions of these elements and/or structures are omitted.

Referring to FIG. 8, the transparent display device may include a pixel area PA and a transmission area TA, and a transmitting window 290a may be defined on the transmission area TA. The transmitting window 290a may be defined by sidewalls of a PDL 255 and a via insulation layer 246, and a top surface of an insulating interlayer 236.

In exemplary embodiments, the second electrode 275 may be selectively disposed only on the pixel area PA, and may not extend on the transmission area TA. Accordingly, a transparency or a transmittance on the transmission area TA may be further improved.

In some embodiments, a deposition control layer 248 may be formed on a portion of an insulating interlayer 236 on the transmission area TA. The deposition control layer 248 may have a non-light emitting property, and may also have an affinity and/or an adhesion for a conductive material, e.g., a metal lower than those of the display layer 260. For example, the deposition control layer 248 may include, e.g., N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H-fluorene-2-amine, or 2-(4-(9,10-di(naphthalen-2-yl)anthracen-2-yl)phenyl)-1-phenyl-1H-benzo-[D]imidazole, etc.

In some embodiments, the second electrode 270 may be also formed on a sidewall of the transmitting window 290a, on which the deposition control layer 248 is not formed.

An encapsulation layer 285 may cover the second electrode 275 and the deposition control layer 248, and may be commonly provided on the pixel area PA and the transmission area TA.

Figure 9:
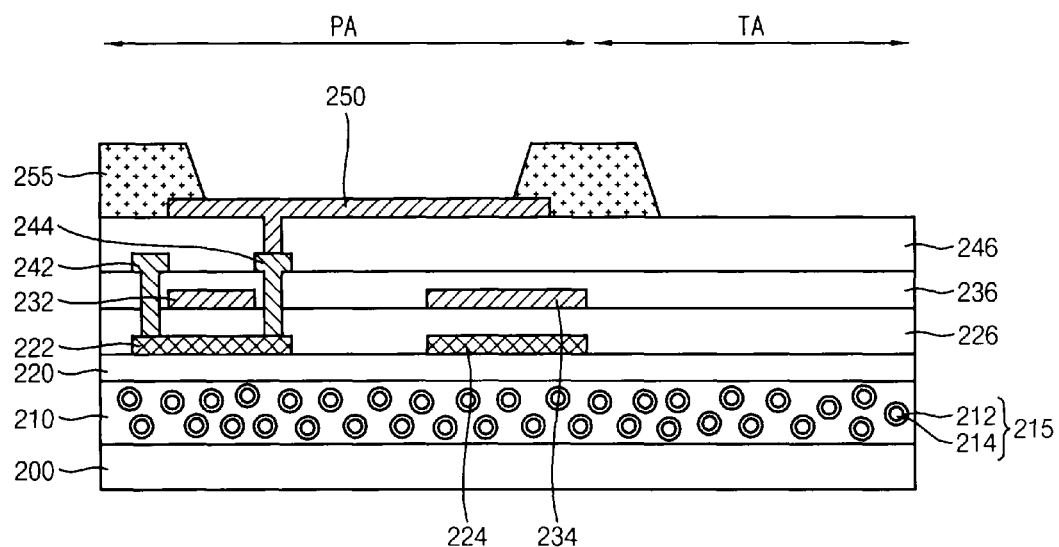
Figure 10:
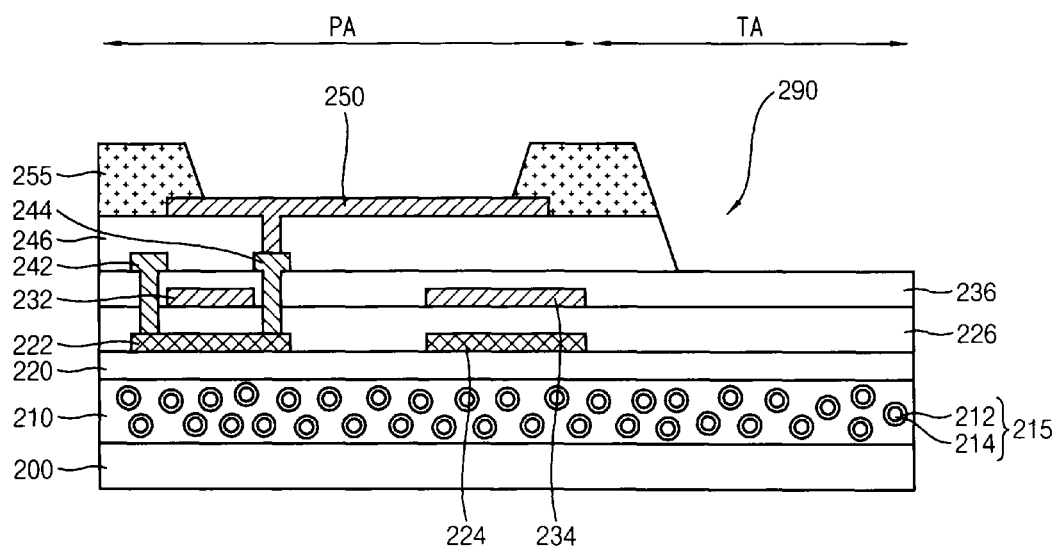
Figure 11:
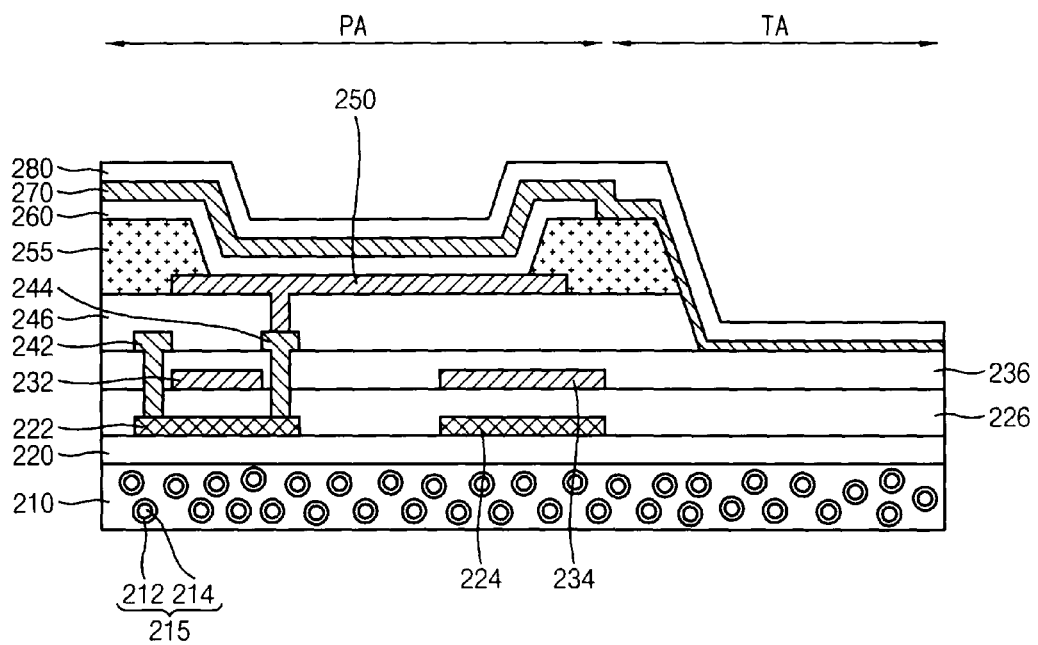

FIGS. 9 to 11 are cross-sectional views illustrating a method of manufacturing a transparent display device in accordance with some exemplary embodiments.

Specifically, FIGS. 9 to 11 are cross-sectional views illustrating a method of manufacturing the transparent display device of FIG. 7. Detailed descriptions on processes and/or materials substantially the same as or similar to those illustrated with reference to FIGS. 3 to 6 are omitted.

Referring to FIG. 9, processes substantially the same as or similar to those illustrated with reference to FIGS. 3 and 4 may be performed.

Accordingly, a substrate 210 including colored particles 215 distributed therein may be formed on a carrier substrate 200. The colored particle 215 may include a dispersed particle 214 and a colored layer 212.

The substrate 210 may be divided into a pixel area PA and a transmission area TA. An insulation structure including a barrier layer 220, a gate insulation layer 226, an insulating interlayer 236 and a via insulation layer 246 may be formed commonly on the pixel area PA and the transmission area TA of the substrate 210.

First and second active patterns 222 and 224, first and second gate electrodes 232 and 234, a source electrode 242 and a drain electrode 244 included in a pixel circuit may be formed on the pixel area PA of the substrate 210.

A first electrode 250 electrically connected to, e.g., a drain electrode 244 may be formed on a portion of the via insulation layer 246 on the pixel area PA. A PDL 255 covering a peripheral portion of the first electrode 250 and exposing the first electrode 250 may be formed.

The PDL 255 may be patterned by, e.g., exposure and developing processes, and a boundary between the pixel area PA and the transmission area TA may be defined by the PDL 255. Accordingly, a top surface of the first electrode 250 may be exposed by the PDL 225 on the pixel area PA, and a top surface of the via insulation layer 246 may be exposed on the transmission area TA.

Referring to FIG. 10, a portion of the via insulation layer 246 on the transmission area TA may be removed to form a transmitting window 290.

For example, a mask including an opening through which the transmission area TA may be selectively exposed may be utilized to partially remove the via insulation layer 246. The via insulation layer 246 may include an organic material substantially the same as or similar to that of the PDL 255.

For example, the via insulation layer 246 may include a photosensitive acryl-based resin material.

Thus, the via insulation layer 246 may be partially removed through, e.g., the exposure and developing processes substantially the same as or similar to those for the formation of the PDL 255. Therefore, the transmitting window 290 may be easily formed without performing an additional etching process.

A stepped portion may be generated between the pixel area PA and the transmission area TA by the transmitting window 290.

Referring to FIG. 11, a display layer 260 may be formed on the first electrode 250 and the PDL 255, and a second electrode 270 may be formed continuously on the pixel area PA and the transmission area TA.

The display layer 260 may be formed by depositing or printing a light emitting material through a FMM that may selectively expose the pixel area PA. The second electrode 270 may be formed by depositing a metal through an open mask that may commonly expose the pixel area PA and the transmission area TA. In this case, the second electrode 270 may be formed continuously along surfaces of the display layer 260 and the PDL 255, and a sidewall and a bottom of the transmitting window 290.

In some embodiments, the second electrode 270 may be deposited to have a relatively small thickness on the transmission area TA due to the stepped portion between the pixel area PA and the transmission area TA.

An encapsulation layer 280 may be formed on the second electrode 270, and may extend continuously on the pixel area PA and the transmission area TA.

Subsequently, as illustrated with reference to FIG. 6, the carrier substrate 200 (not illustrated in FIG. 11) may be detached from the substrate 210 to obtain the transparent display device.

According to exemplary embodiments described above, the via insulation layer 246 including a material substantially the same as or similar to that included in the PDL 255 may be selectively removed on the transmission area TA to form the transmitting window 290. A predetermined transmittance of the display device may be achieved using the substrate 210 that may include colored particles or blue dye materials, and insulation layers including inorganic materials such as silicon oxide and silicon nitride may not be etched on the transmission area TA to be remained thereon. Accordingly, a display device having an improved transparency may be manufactured while reducing a process time and a process cost.

Figure 12:
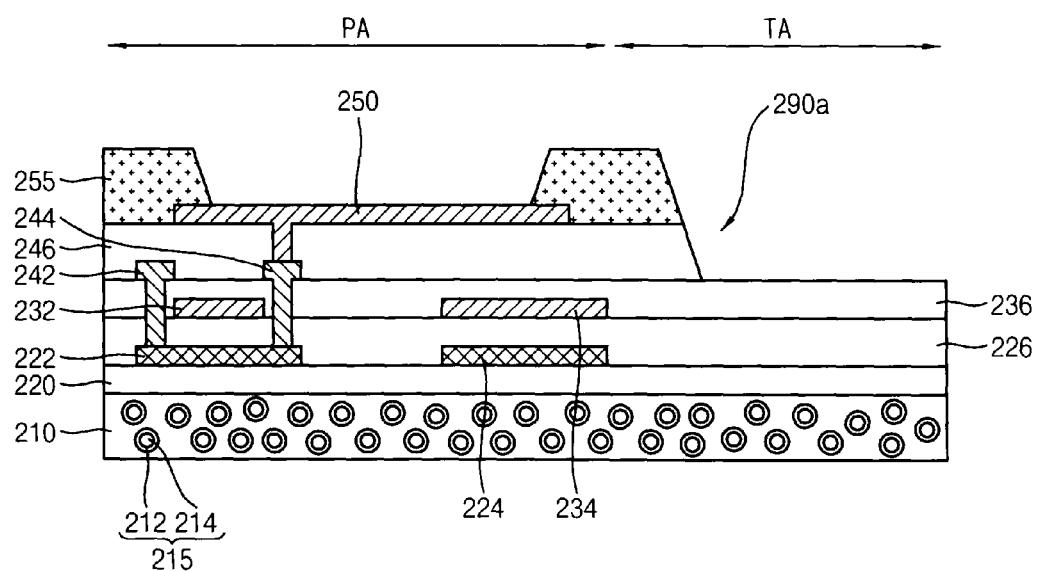
Figure 13:
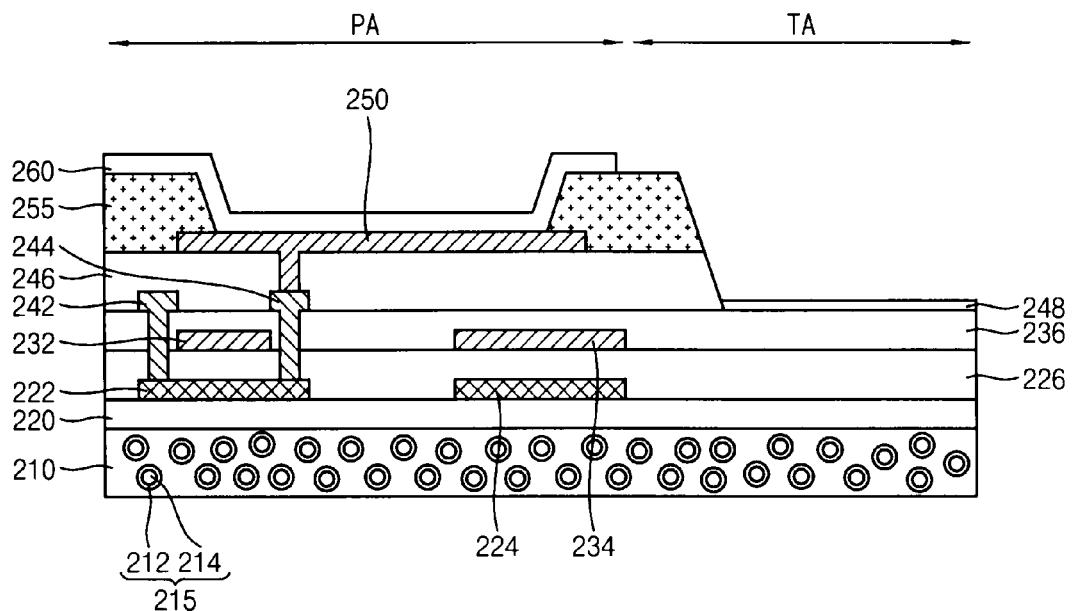
Figure 14:
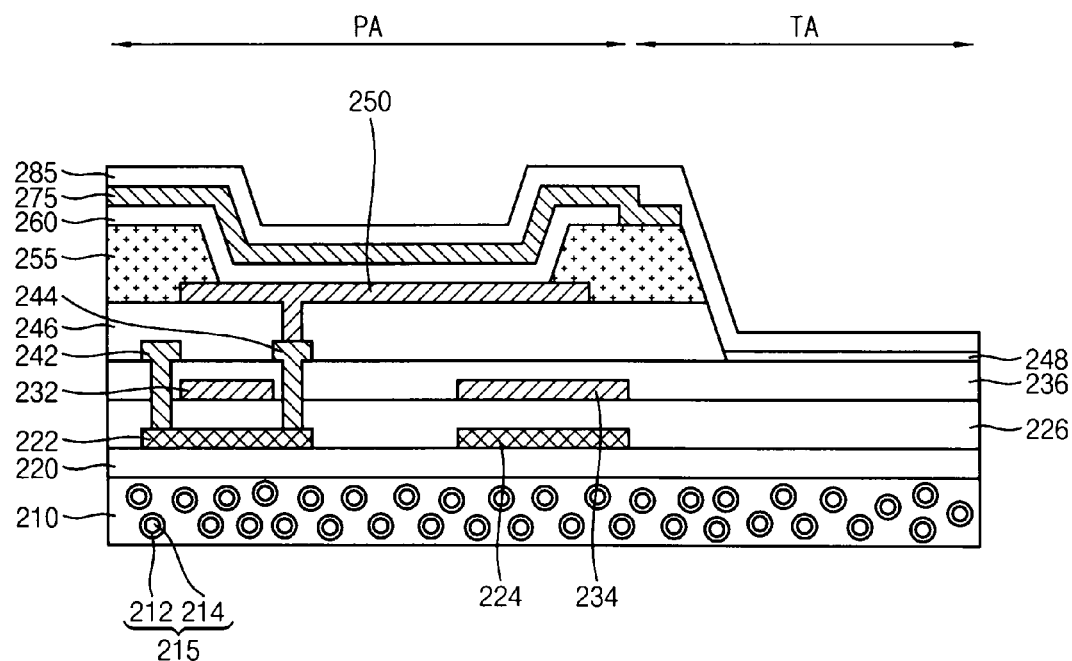

FIGS. 12 to 14 are cross-sectional views illustrating a method of manufacturing a transparent display device in accordance with some exemplary embodiments.

Specifically, FIGS. 12 to 14 are cross-sectional views illustrating a method of manufacturing the transparent display device of FIG. 8. Detailed descriptions on processes and/or materials substantially the same as or similar to those illustrated with reference to FIGS. 3 to 6, or FIGS. 9 to 11 are omitted.

Referring to FIG. 12, processes substantially the same as or similar to those illustrated with reference to FIGS. 9 and 10 may be performed.

Accordingly, a pixel circuit and an insulation structure may be formed on a substrate 210 which may be substantially transparent by a color addition or a color correction with colored particles 215 or blue dye molecules. A first electrode 250 may be formed on a pixel area PA, and a PDL 255 defining a boundary between the pixel area PA and a transmission area TA may be formed.

A portion of a via insulation layer 246 on the transmission area TA may be removed to form a transmitting window 290a.

Referring to FIG. 13, a deposition control layer 248 may be formed on a top surface of an insulating interlayer 236 exposed by the transmitting window 290a. The deposition control layer 248 may be formed by depositing or printing a deposition control material through a FMM selectively exposing the transmission area TA.

The deposition control material may have a non-light emitting property, and may also have an affinity and/or an adhesion for a conductive material such as a metal lower than those of a display layer 260. For example, the deposition control material may include, e.g., N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H -fluorene-2-amine, or 2-(4-(9,10-di(naphthalen-2-yl)anthracen-2-yl)phenyl)-1-phenyl-1H-benzo-[D]imidazole, etc.

Referring to FIG. 14, a display layer 260 may be formed on the PDL 255 and the first electrode 250, and a second electrode 275 may be formed on the display layer 260 and the PDL 255.

In exemplary embodiments, while depositing a metal by, e.g., a sputtering process for the formation of the second electrode 275, the second electrode 275 may be substantially and selectively formed on the pixel area PA because the deposition control layer 248 may have the poor affinity and/or adhesion for the metal.

FIG. 14 illustrates that the second electrode 275 is formed only on the pixel area PA. However, the second electrode 275 may optionally be formed to have a very small thickness on the transmission area TA (not shown) by a repulsive force from the deposition control layer 248

As described above, the second electrode 275 may be removed or have a relatively small thickness on the transmission area TA, so that a transmittance on the transmission area TA may be further improved.

An encapsulation layer 285 may be formed on the second electrode 275 and the deposition control layer 248, and may be commonly provided on the pixel area PA and the transmission area TA. Subsequently, a carrier substrate 200 may be detached from the substrate 210 as illustrated in FIG. 6 to form the transparent display device.

According to exemplary embodiments, a colored polymer substrate may be employed as a base substrate to improve flexible and mechanical properties. Further, colored particles or colored dye molecules may be embedded in the colored polymer substrate to achieve a substantially transparent substrate. The transparent substrate may be combined with a structure of a transmission area to obtain a transparent display device having an improved transmittance.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A transparent display device, comprising:
a substrate comprising a pixel area and a transmission area, the substrate comprising colored particles dispersed therein throughout the pixel area and the transmission area;
a barrier layer on the substrate;

a pixel circuit selectively disposed on a portion of the barrier layer on the pixel area;

a circuit insulation layer at least partially covering the pixel circuit on the barrier layer;

a via insulation layer covering the pixel circuit on the circuit insulation layer;

a first electrode on the via insulation layer, the first electrode being electrically connected to the pixel circuit;

a display layer on the first electrode; and a second electrode facing the first electrode and covering the display layer, wherein the via insulation layer is disposed only on the pixel area, and wherein the substrate is a transparent flexible substrate.

2. The transparent display device of claim 1, wherein the substrate further comprises a colored polymer material having a color different from a color of the colored particles.

3. The transparent display device of claim 2, wherein the colors of the colored particles and the colored polymer material are added to each other such that the substrate becomes transparent.

4. The transparent display device of claim 3, wherein the color of the colored particles is blue, and the color of the colored polymer material is yellow.

5. The transparent display device of claim 1, further comprising a pixel defining layer on the via insulation layer, the pixel defining layer exposing a top surface of the first electrode, wherein a transmitting window is defined on the transmission area by sidewalls of the pixel defining layer and the via insulation layer.

6. The transparent display device of claim 5, wherein the circuit insulation layer comprises a gate insulation layer and an insulating interlayer sequentially stacked on the barrier layer, the gate insulation layer and the insulating interlayer extend commonly on the pixel area and the transmission area, and a top surface of the insulating interlayer is exposed by the transmitting window.

7. The transparent display device of claim 6, wherein the barrier layer, the gate insulation layer, and the insulating interlayer comprise a silicon-based inorganic material, and the via insulation layer comprises an organic polymer material.

8. The transparent display device of claim 4, wherein the colored polymer material comprises a polyimide-based material, and a charge transfer complex (CTC) is formed by an intermolecular interaction between imide nitrogens and carbonyl groups included in the polyimide-based material.

9. The transparent display device of claim 8, wherein a connecting group comprising an unsubstituted aromatic ring is combined between the imide nitrogens neighboring each other.

10. The transparent display device of claim 4, wherein each of the colored particles comprises:

a dispersed particle; and a colored layer coating the dispersed particle or penetrating pores of the dispersed particle.

11. The transparent display device of claim 10, wherein the dispersed particle comprises a silica nano-particle or a metal oxide particle.

12. The transparent display device of claim 10, wherein the colored layer comprises at least one of anthraquinone, azo, phthalocyanine, indigo, and quinophthalone based materials.

13. The transparent display device of claim 4, wherein the colored particles consist of blue dye molecules dispersed in the substrate.

14. The transparent display device of claim 13, wherein the blue dye molecules are polymerized together with a precursor of the colored polymer material to be integrally incorporated with the colored polymer material.

* * * * *